US007052923B2

(12) United States Patent
Raina

(10) Patent No.: US 7,052,923 B2
(45) Date of Patent: May 30, 2006

(54) FIELD EMISSION DISPLAY WITH SMOOTH ALUMINUM FILM

(75) Inventor: Kanwal K. Raina, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 62 days.

(21) Appl. No.: 10/931,314

(22) Filed: Sep. 1, 2004

(65) Prior Publication Data

US 2005/0164417 A1 Jul. 28, 2005

Related U.S. Application Data

(62) Division of application No. 10/060,842, filed on Jan. 29, 2002, now Pat. No. 6,838,815, which is a division of application No. 09/243,942, filed on Feb. 4, 1999, now Pat. No. 6,537,427.

(51) Int. Cl.
*H01L 21/00* (2006.01)
*H01L 31/26* (2006.01)

(52) U.S. Cl. ............................. 438/20; 445/46; 427/77

(58) Field of Classification Search .................. 438/20; 445/46, 58

See application file for complete search history.

(56) References Cited

U.S. PATENT DOCUMENTS

| | | | |
|---|---|---|---|
| 4,125,446 | A | 11/1978 | Hartsough et al. |
| 4,792,842 | A | 12/1988 | Honma et al. |
| 5,147,819 | A | 9/1992 | Yu et al. |
| 5,229,331 | A | 7/1993 | Doan et al. |
| 5,358,908 | A | 10/1994 | Reinberg et al. |
| 5,372,973 | A | 12/1994 | Doan et al. |
| 5,808,401 | A | 9/1998 | Jin et al. |
| 5,902,650 | A | 5/1999 | Feng et al. |
| 5,910,704 | A | 6/1999 | Choo |
| 5,923,953 | A | 7/1999 | Goldenberg Barany et al. |
| 5,929,527 | A | 7/1999 | Yamazaki et al. |
| 5,969,386 | A | 10/1999 | Hong |
| 6,000,980 | A | 12/1999 | Baldi et al. |
| 6,020,683 | A | 2/2000 | Cathey et al. |
| 6,064,149 | A | 5/2000 | Raina |
| 6,137,212 | A | 10/2000 | Liu et al. |
| 6,154,188 | A | 11/2000 | Learn et al. |
| 6,211,608 | B1 | 4/2001 | Raina et al. |
| 6,252,247 | B1 | 6/2001 | Sakata et al. |
| 6,537,427 | B1 | 3/2003 | Raina |
| 6,638,399 | B1 | 10/2003 | Raina |
| 6,838,815 | B1 | 1/2005 | Raina |

OTHER PUBLICATIONS

Sowers, et al., Thin films of aluminum nitride and aluminum gallium nitride for cold cathode applications, Applied Physics Letters, vol., 71, No. 16, Oct. 20, 1997, pp 2289-2291.*

(Continued)

*Primary Examiner*—W. David Coleman
(74) *Attorney, Agent, or Firm*—Knobbe Martens Olson & Bear LLP

(57) ABSTRACT

This invention provides a conductive aluminum film and method of forming the same, wherein a non-conductive impurity is incorporated into the aluminum film. In one embodiment, the introduction of nitrogen creates an aluminum nitride subphase which pins down hillocks in the aluminum film to maintain a substantially smooth surface. The film remains substantially hillock-free even after subsequent thermal processing. The aluminum nitride subphase causes only a nominal increase in resistivity (resistivities remain below about 12 μΩ-cm), thereby making the film suitable as an electrically conductive layer for integrated circuit or display devices.

11 Claims, 3 Drawing Sheets

OTHER PUBLICATIONS

Takagi et al., "P2.2-3 Characterization of Al-Nd Alloy Thin Films for Interconnections of TFT-LCDs" Asia Display 1995, 4 pages.

Takayama et al., "Al-Sm and Al-Dy alloy thin films with low resistivity and high thermal stability for microelectronic conductor lines", Thin Solid Films 289, 1996 pp. 289-294.

Kim et al., "22.2 Pure Al and Al-Alloy Gate-Line Processes in TFT-LCDs", SID 96 Digest, pp. 337-340.

Office Action, Appl. No. 10/931,516, dated May 24, 2005, and Response to Officee Action filed Apr. 26, 2005.

* cited by examiner

FIELD EMISSION DISPLAY WITH SMOOTH ALUMINUM FILM

This is a Divisional of U.S. application Ser. No. 10/060,842, filed on Jan. 29, 2002 now U.S. Pat. No. 6,838,815, which is a divisional of U.S. application Ser. No. 09/243,942 filed on Feb. 4, 1999, now U.S. Pat. No. 6,537,427. The entire contents of the above patent and application are incorporated herein by reference.

REFERENCE TO GOVERNMENT CONTRACT

This invention was made with United States Government support under Contract No. DABT63-97-0001, awarded by the Advanced Research Projects Agency (ARPA). The United States Government has certain rights to this invention.

BACKGROUND OF THE INVENTION

1. Field of the Invention

This invention relates to forming smooth aluminum films, and more particularly, to a method of depositing aluminum having a subphase of aluminum nitride to produce a hillock-free aluminum film.

2. Description of the Related Art

Metallic films are commonly used to form interconnects on integrated circuits and for display devices such as field emission displays (FEDs). Aluminum is a popular material choice for such films because of its low resistivity, adhesion properties, and mechanical and electrical stability. However, aluminum also suffers from process-induced defects such as hillock formation which may severely limit its performance.

Hillocks are small nodules which form when the aluminum film is deposited or subjected to post-deposition processing. For example, hillocks can result from excessive compressive stress induced by the difference in thermal expansion coefficient between the aluminum film and the underlying substrate used during post-deposition heating steps. Such thermal processing is typical in the course of semiconductor fabrication. Hillock formation may create troughs, breaks, voids and spikes along the aluminum surface. Long term problems include reduced reliability and increased problems with electromigration.

Hillocks may create particularly acute problems in the fabrication of integrated FED and similar devices. Many FEDs comprise two parallel layers of an electrically conductive material, typically aluminum, separated by an insulating layer to create the electric field which induces electron emission. The insulating film is deliberately kept thin (currently about 1–2 μm), to increase the field effect. Hillock formation in the underlying aluminum layer may create spikes through the insulating layer, resulting in a short circuit and complete failure of the device.

Some efforts have been made to reduce or prevent the formation of hillocks in aluminum films. For instance, alloys of aluminum with Nd, Ni, Zr, Ta, Sm and Te have been used to create aluminum alloy thin films which reduce the formation of hillocks. These alloys, however, have been unsatisfactory in producing low resistivity metal lines while still avoiding hillock formation after exposure to thermal cycling.

Accordingly, there is a need for a smooth aluminum film having low resistivity suitable for integrated circuit and field effect display technologies. In particular, the aluminum film should remain hillock-free even after subsequent thermal processing.

SUMMARY OF THE INVENTION

The needs addressed above are solved by providing aluminum films, and methods of forming the same, wherein a non-conductive impurity is introduced into the aluminum film. In one embodiment, the introduction of nitrogen creates an aluminum nitride subphase to maintain a substantially smooth surface. The film remains substantially hillock-free even after subsequent thermal processing. The aluminum nitride subphase causes only a nominal increase in resistivity, thereby making the film suitable as an electrically conductive layer for integrated circuit or display devices.

In one aspect of the present invention, a method of forming an electrically conductive metal film for an integrated circuit is provided. The method comprises depositing an aluminum layer onto a substrate assembly, and introducing nitrogen into the aluminum layer while depositing the layer.

In another aspect of the present invention, a method of depositing an aluminum film onto a substrate assembly is provided. The method comprises supplying an inert gas and a nitrogen source gas into a sputtering chamber. The chamber houses the substrate assembly and an aluminum target. The aluminum film is sputtered onto the substrate assembly. In one preferred embodiment, the resultant aluminum film incorporates a sub-phase of aluminum nitride. Exemplary gases introduced into the chamber are Ar and $N_2$. Desirably, $H_2$ is also introduced to further suppress hillock formation in the sputtered film.

In another aspect of the present invention, an electrically conductive aluminum film in an integrated circuit is provided. This film comprises aluminum grains and about 2–10% nitrogen. In one preferred embodiment, the film has a resistivity of between about 5 and 10 μΩ cm.

In another aspect of the present invention, a field emission device is provided with a smooth, electrically conductive aluminum layer. The device includes a faceplate and a baseplate, and a luminescent phosphor coating applied to a lower surface of the faceplate to form phosphorescent pixel sites. A cathode member is formed on the baseplate to form individual electron-emission sites which emit electrons to activate the phosphors. The cathode member includes a first semiconductor layer, an emitter tip, an aluminum layer surrounding the tip and incorporating nitrogen, an insulating layer surrounding the tip and overlying the aluminum layer, and a conductive layer overlying the insulating layer.

In another aspect of the present invention, an electrically conductive aluminum wiring element is provided. The film comprises aluminum grains and about 5 to 8% nitrogen in an aluminum nitride subphase. The film has a resistivity of less than about 12 μΩ-cm and a surface roughness of less than about 500 Å.

DETAILED DESCRIPTION OF THE PREFERRED EMBODIMENTS

The preferred embodiments describe a smooth aluminum film used as an electrically conductive material for integrated circuit and display devices, and methods of manufacturing the same. The term "aluminum film" as used herein refers not only to a film consisting purely of aluminum, but also to an aluminum film having small amounts of impurities or alloying materials. For instance, an aluminum film containing aluminum nitride, as described in the preferred embodiments below, is an "aluminum film" as contemplated by the present invention.

Field Emission Displays

Aluminum films are particularly useful in devices such as flat panel field emission displays. Field emission displays are currently being touted as the flat panel display type poised to take over the liquid crystal display (LCD) market. FEDs have the advantages of being lower cost, with lower power consumption, having a better viewing angle, having higher brightness, having less smearing of fast moving video images, and being tolerant to greater temperature ranges than other display types.

Figure 1:
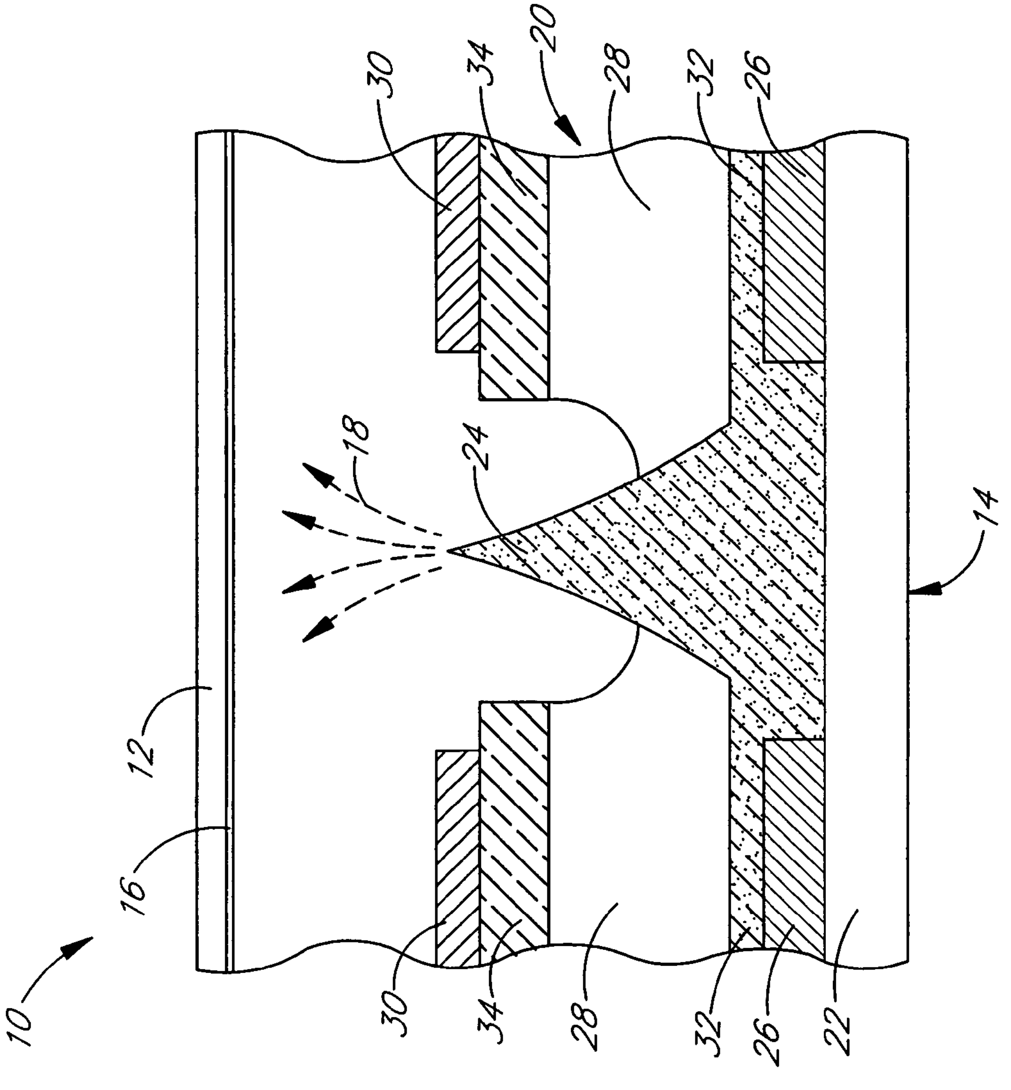
FIG. 1 is a schematic diagram of a field emission device incorporating a smooth aluminum film according to a preferred embodiment of the present invention.

FIG. 1 shows an emitting unit of an FED 10. The FED 10 comprises a faceplate 12 and a baseplate 14. A luminescent phosphor coating 16 is applied to the lower surface of the faceplate 12 to form phosphorescent pixel sites. Electrons 18 from a cathode member 20 bombard the coating 16 to cause phosphorescence. The field emission cathode 20 generally comprises a base or substrate 22, an emitter tip 24, a conductive layer 26, an insulating layer 28, and a gate material 30. The skilled artisan will understand that multiple emitters can form one pixel with greater brightness than a single emitter. Furthermore, a plurality of pixels across the FED 10 are illuminated in a pre-determined spatial and temporal pattern to produce an image. Further details regarding FEDs are disclosed in U.S. Pat. No. 5,372,973 (the '973 patent"), the disclosure of which is hereby incorporated by reference in its entirety.

The base or substrate 22 is preferably made of glass, though the skilled artisan will recognize other suitable materials. The emitter tip 24 is preferably a single crystal silicon material. The conductive layer 26 and the gate material 30 both preferably comprise metal films. More preferably, the layers 26 and 30 are aluminum films incorporating a non-conductive impurity having the preferred composition and formed according to the preferred method described below. Thus, the aluminum film 26 preferably comprises about 2 to 10% nitrogen. In contrast to resistive aluminum nitride films (with resistivities of greater than 10 Ω-cm), the illustrated aluminum film comprising nitride is conductive, and preferably has a resistivity of less than about 12 μΩ-cm.

In the illustrated FED 10, a resistive layer 32 overlies the aluminum film 26, preferably comprising B-doped silicon. The insulating layer 28 may be a dielectric oxide such as silicon oxide, borophosphosilicate glass, or similar material. The thickness of the insulating layer 28 is preferably about 1 to 2 μm. As illustrated, a layer 34 of grid silicon is formed between the dielectric layer 28 and the gate layer 30.

The individual elements and functions of these layers are more fully described in the '973 patent.

Preferred Aluminum Film Composition

As described above, aluminum films are used for electrically conductive layers in FED devices. Aluminum films are also employed as contacts, electrodes, runners or wiring in general in integrated circuits of other kinds (e.g., DRAMs, micro-processors, etc.). In the preferred embodiment of the present invention, an aluminum film suitable for an FED or other IC device incorporates a non-conductive impurity into the film. More particularly, an aluminum film having low resistivity preferably contains about 2% to 10% nitrogen, more preferably about 5% to 8%, in an aluminum nitride subphase. The resistivity of a film incorporating nitrogen is preferably less than about 12 μΩ-cm, more preferably less than about 10 μΩ-cm, and in the illustrated embodiments has been demonstrated between about 5 μΩ-cm and 7 μΩ-cm.

Moreover, the aluminum film with this composition is also substantially hillock-free. It is believed that the presence of nitrogen in the aluminum film forms aluminum nitride which pins down the (110) plane of aluminum, thereby preventing hillocks from forming. The surface roughness of this aluminum film is preferably below about 500 Å. Measurements conducted on an aluminum film containing an aluminum nitride subphase with a thickness of about 0.3 μm shows that this film has a surface roughness in the range of about 300–400 Å. It has been found that this film maintains its smoothness without hillock formation even after exposure to subsequent high temperature steps. For example, after processing at temperatures of about 300° C. or greater, the aluminum film remained substantially hillock-free. Inspection of the films in cross-section after a pad etch disclosed significantly less porous films than those incorporating oxygen, for example.

The Preferred Sputtering Process

Figure 2:
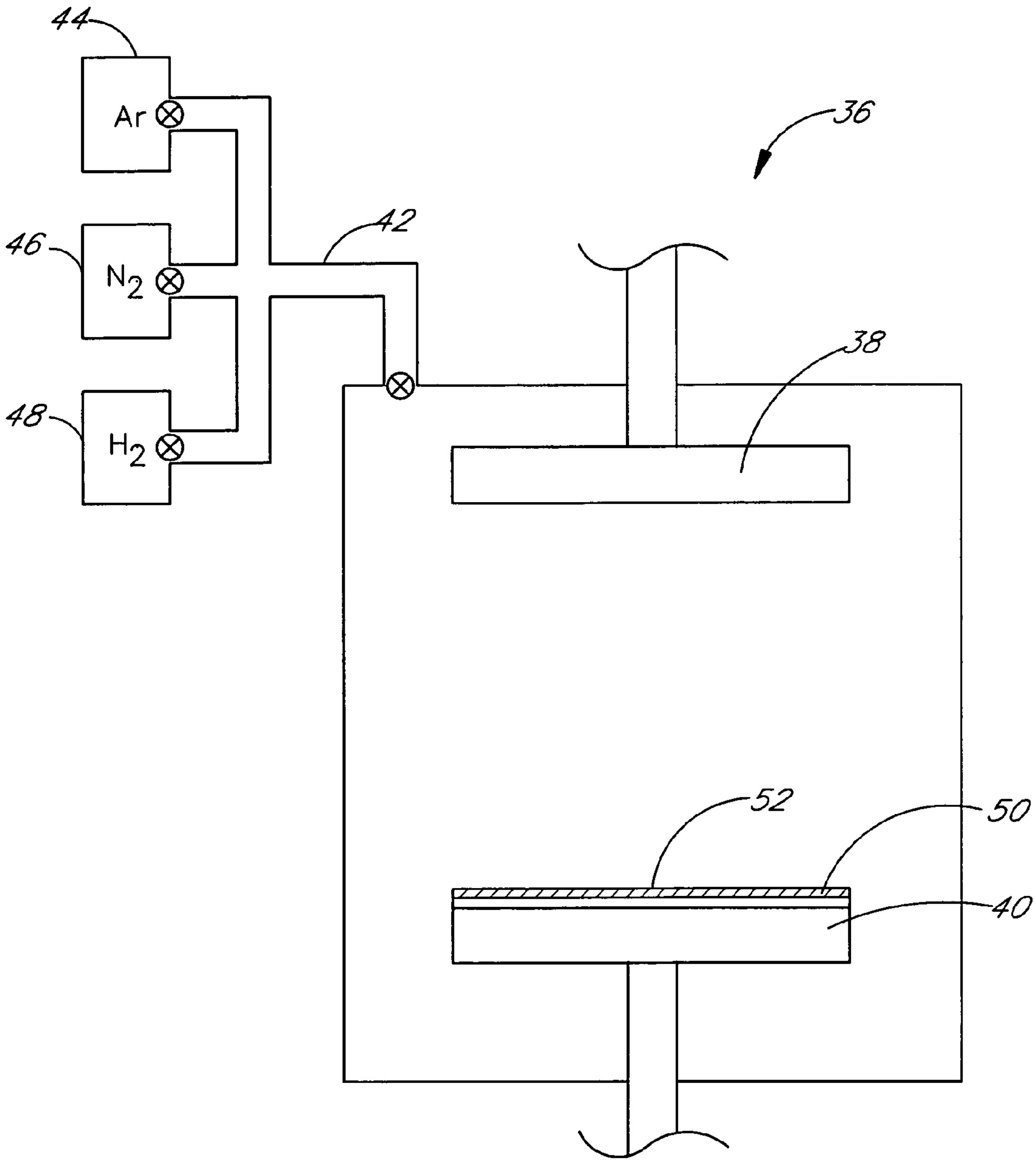
FIG. 2 is a schematic diagram of a sputtering chamber used to form the smooth aluminum film according to a preferred embodiment.

Aluminum films in accordance with the invention are preferably formed by a physical vapor deposition process such as sputtering. FIG. 2 schematically shows a sputtering chamber 36 for forming an aluminum film in a preferred embodiment. The illustrated chamber 36 is a DC magnetron sputtering chamber, such as available from Kurdex. The skilled artisan will recognize that other sputtering equipment can also be used. The chamber 36 houses a target cathode 38 and a pedestal anode 40. The target 38 is preferably made of aluminum or an aluminum alloy. In the illustrated embodiment, the sputtering chamber 36 is provided with a substantially pure aluminum target 38. Preferably, the aluminum target is at least about 99% pure, and more preferably at least about 99.995% pure. One or more gas inlets 42 may be provided to allow gas to flow from external gas sources into the chamber 36.

The gas inlet 42 supplies the chamber 36 with gases from a plurality of sources 44, 46, and 48. Preferably, a heavy inert gas such as argon is provided from an inert gas source 44 connected to the chamber 36 to be used in bombarding the target 38 with argon ions. Additionally, an impurity source gas such as $N_2$ is provided into the chamber 36 from an impurity source 46. Carrier gas is preferably also provided into the chamber 36 from an $H_2$ gas source 22.

In operation, a workpiece or substrate 50 is mounted on the pedestal 40. As used herein, the substrate 50 comprises a partially fabricated integrated circuit. The illustrated substrate 50 comprises the glass substrate 22 on which the FED base plate 14 will be formed (see FIG. 1). Argon gas flows into the chamber 36 at a rate of between about 25 sccm and 50 sccm. $N_2$ gas flow is preferably between about 2 sccm and 7 sccm, more preferably about 3 sccm to 5 sccm. $H_2$ gas flow aids in maintaining the plasma, and preferably ranges from about 2 sccm to 50 sccm. The preferred chamber operates at a power preferably of about 1 kW to 3.5 kW, and a pressure preferably of at least about 0.1 mTorr, more preferably at about 0.5 mTorr to 10 mTorr. The skilled artisan will readily appreciate that these parameters can be adjusted for sputtering chambers of different volumes, electrode areas and electrode spacing. Three examples are given in the TABLE below, providing suitable parameters for sputtering according to the preferred embodiment.

TABLE

| | Ar Gas Flow (sccm) | $N_2$ Gas Flow (sccm) | $H_2$ Gas Flow (sccm) | Pressure (mTorr) | Power (kW) |
|---|---|---|---|---|---|
| Example One | 25 | 5 | 25 | 0.55 | 3.0 |
| Example Two | 50 | 5 | 50 | 1 | 3.0 |
| Example Three | 25 | 3 | 6 | 0.50 | 3.0 |

Under the preferred sputtering conditions described above, Ar ions strike the target 38, liberating aluminum atoms and causing an aluminum film 52 to form on the substrate 50, as shown in FIG. 2. Due to the presence of an impurity source gas ($N_2$ in the illustrated embodiment) in the chamber 36, the sputtered aluminum film 52 incorporates an impurity, specifically nitrogen. Of the above three examples, the conditions provided in Example 3 produced the most robust film.

The film 52 thus comprises aluminum grains with an aluminum nitride subphase, and may also comprise a surface oxide. The surface oxide may form by spontaneous oxidation of the surface aluminum due to exposure to air, moisture or $O_2$. Depending on the use, the sputtering conditions are generally maintained until an aluminum film having a thickness of about 0.01 μm to 1 μm, more preferably about 0.1 μm to 0.5 μm.

Figure 3:
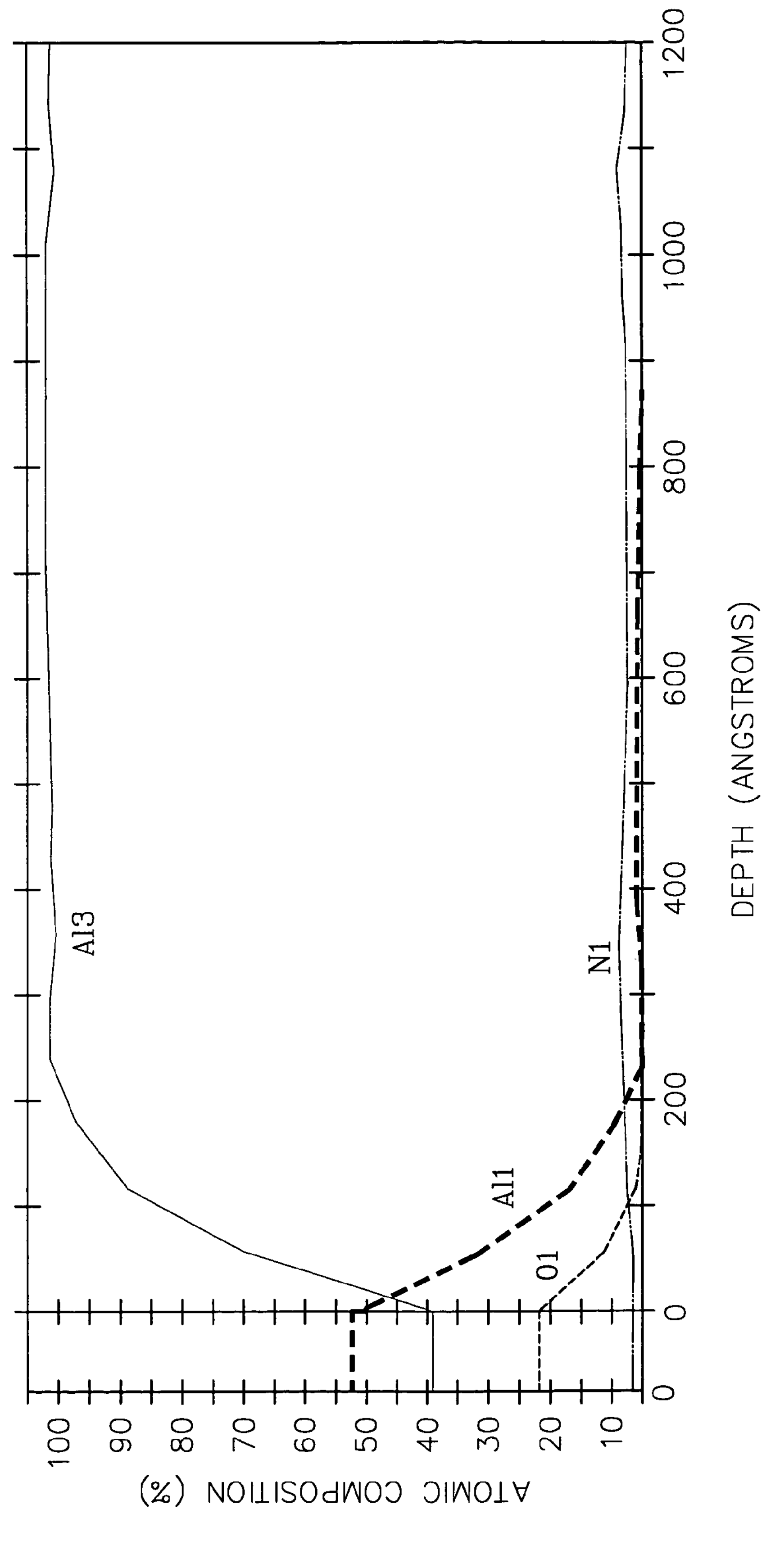
FIG. 3 is an XPS profile of an aluminum layer formed in accordance with the preferred sputtering method.

With reference to FIG. 3, the composition of an exemplary aluminum film 52 formed by the preferred process is given. Due to the nitrogen gas flow, nitrogen content in the film 52 is at least about 2%, more preferably about 2% to 10%, and desirably about 5% to 8%. XPS analysis as shown in FIG. 3 indicates that for the conditions given by the two examples above, nitrogen content in the aluminum film 52 is about 7% to 8%.

As will be understood by the skilled artisan in light of the present disclosure, similar nitrogen content is maintained in the three examples by adjusting the Ar:$N_2$ ratio for different chamber pressures (for a given power). Thus, where the pressure was kept at about 0.55 mTorr, the ratio of Ar:$N_2$ was preferably about 5:1 to 6:1, more preferably about 5:1. At about 1.0 mTorr, the ratio was preferably about 10:1 to 12:1. At a pressure of about 0.50 mTorr, the ratio was preferably about 5:1 to 10:1.

Power above 3.5 kW resulted in an unstable film 52 interface with the preferred glass substrate 50. At the same time, power of less than 2.0 kW resulted in resistivities higher than about 12 μΩ-cm, indicating excessive nitrogen incorporation. The skilled artisan will recognize, however, that the above-discussed parameters are inter-related such that, in other arrangements, power levels, gas ratios, pressures, and/or temperature levels can be outside the above-noted preferred ranges.

Furthermore, although $H_2$ carrier gas flow in the sputtering process is not necessary, it has been found that the addition of $H_2$ gas acts to further suppress hillock-formation in the film. Thus, the film 52 has superior smoothness and a low resistivity making it suitable for a wide variety of semiconductor devices, and particularly for FED panels. The $H_2$ gas flow is preferably between about 15% and 100% of the Ar gas flow, and in Example 3, listed in the Table above, $H_2$ flow at about 24% of Ar gas flow resulted in a robust, hillock-free film.

The preferred embodiments described above are provided merely to illustrate and not to limit the present invention. Changes and modifications may be made from the embodiments presented herein by those skilled in the art, without departing from the spirit and scope of the invention, as defined by the appended claims.

What is claimed is:

1. A method of forming a field emission display device comprising the steps of:

providing a faceplate and a baseplate;

applying a luminescent phosphor coating to a lower surface of the faceplate to form phosphorescent pixel sites; and forming a cathode member on the baseplate to form individual electron-emission sites which emit electrons to activate the phosphors, the steps of forming the cathode member comprising:

providing a semiconductor layer overlying a substrate, the semiconductor layer including an emitter tip;

depositing an aluminum layer on the substrate surrounding the tip and introducing nitrogen during depositing;

forming an insulating layer surrounding the tip and overlying the aluminum layer; and depositing a conductive layer surrounding the tip and overlying the insulating layer.

2. The cathode of claim 1, further comprising providing a layer of grid silicon between the insulating layer and the conductive layer.

3. The cathode of claim 1, wherein the aluminum layer comprises an atomic composition of about 2%–10% nitrogen.

4. The cathode of claim 1, wherein the aluminum layer is substantially hillock-free.

5. The method of claim 1, wherein said conductive layer is an aluminum film, and further comprising introducing nitrogen while depositing said aluminum film.

6. The method of claim 5, comprising sputtering a substantially pure aluminum target in a chamber housing the substrate.

7. The method of claim 5, wherein the conductive layer comprises an atomic composition of about 2%–10% nitrogen.

8. The method of claim 5, wherein the conductive layer comprises an atomic composition of about 5%–8% nitrogen.

9. The method of claim 5, wherein both the aluminum layer and the conductive layer have a resistivity of less than about 10 μΩ cm.

10. The method of claim 5, wherein both the aluminum layer and the conductive layer have a surface roughness of about 300 Å to 400 Å.

11. The method of claim 5, wherein both the aluminum layer and the conductive layer are substantially hillock-free.

* * * * *

UNITED STATES PATENT AND TRADEMARK OFFICE

CERTIFICATE OF CORRECTION

PATENT NO. : 7,052,923 B2
APPLICATION NO. : 10/931314
DATED : May 30, 2006
INVENTOR(S) : Kanwal K. Raina It is certified that error appears in the above-identified patent and that said Letters Patent is hereby corrected as shown below:

On Title Page Item (56) (Other Publications), line 1 delete "Thin" and insert -- "Thin --, therefor.

On Title Page Item (56) (Other Publications), line 2 delete "applications," and insert -- applications", --, therefor.

On Title Page Item (56) (Other Publications), line 3 delete "pp" and insert -- pp. --, therefor.

On Title Page Item (56) Page 2 (Other Publications), line 5 delete "Officee" and insert -- Office --, therefore.

Column 1, line 5, after "2002" insert -- , --, therefore.

Column 1, Line 6, after "09/243,942" insert -- , --, therefore.

Column 2, Line 37, delete "10 μΩ cm." and insert -- 10 μΩ-cm. --, therefor.

Column 3, Line 39, delete "patent")," and insert -- patent), --, therefor.

Column 4, Line 59, delete "base plate" and insert -- baseplate --, therefor.

Column 6, Line 34, Claim 2, delete "The cathode of" and insert -- The method of --, therefor.

Column 6, Line 37, Claim 3, delete "The cathode of" and insert -- The method of --, therefor.

Column 6, Line 40, Claim 4, delete "The cathode of" and insert -- The method of --, therefor.

UNITED STATES PATENT AND TRADEMARK OFFICE

CERTIFICATE OF CORRECTION

PATENT NO. : 7,052,923 B2
APPLICATION NO. : 10/931314
DATED : May 30, 2006
INVENTOR(S) : Kanwal K. Raina It is certified that error appears in the above-identified patent and that said Letters Patent is hereby corrected as shown below:

Column 9, Line 55, Claim 9, delete "10 μΩ cm." and insert -- 10 μΩ-cm. --, therefor.

Signed and Sealed this

Twenty-ninth Day of May, 2007

JON W. DUDAS
*Director of the United States Patent and Trademark Office*